US012677596B2

(12) United States Patent
Wang et al.

(10) Patent No.: US 12,677,596 B2
(45) Date of Patent: Jul. 7, 2026

(54) PIEZOELECTRIC VIBRATION ENERGY HARVESTER AND DESIGN METHOD THEREOF

(71) Applicant: Zhejiang Gongshang University, Hangzhou (CN)

(72) Inventors: Guangqing Wang, Hangzhou (CN); Zhoulong Liu, Hangzhou (CN)

(73) Assignee: Zhejiang Gongshang University, Hangzhou (CN)

( * ) Notice: Subject to any disclaimer, the term of this patent is extended or adjusted under 35 U.S.C. 154(b) by 648 days.

(21) Appl. No.: 18/333,569

(22) Filed: Jun. 13, 2023

(65) Prior Publication Data

US 2023/0403937 A1     Dec. 14, 2023

(30) Foreign Application Priority Data

Jun. 14, 2022    (CN) .......................... 202210668682.8

(51) Int. Cl.
*H10N 30/30*          (2023.01)
*H02N 2/00*          (2006.01)
(Continued)

(52) U.S. Cl.
CPC ........... *H10N 30/306* (2023.02); *H02N 2/186* (2013.01); *H02N 2/22* (2013.01); *H10N 30/03* (2023.02);
(Continued)

(58) Field of Classification Search
CPC .... H10N 30/306; H10N 30/03; H10N 30/853; H10N 30/886; H02N 2/186; H02N 2/22
See application file for complete search history.

(56) References Cited

U.S. PATENT DOCUMENTS 6,411,010 B1 *  6/2002  Suzuki ................. H02N 2/0015
                                          310/323.16
7,231,874 B2 *  6/2007  Rastegar ................. F42B 10/14
                                          102/209
(Continued)

FOREIGN PATENT DOCUMENTS

CN          103516257 A  *  1/2014  ............. H02N 2/188
EP            2677656 A2 * 12/2013  ............. H02N 2/188
(Continued)

OTHER PUBLICATIONS

Wook Hyun Kwon, "Active Vibration Isolation System Based on Piezoelectric Smart Materials", 2015, International Journal of Civil Engineering and Environmental Science. vol. 3, Issue 1. (Year: 2015).*
(Continued)

*Primary Examiner* — Pedro J Cuevas
(74) *Attorney, Agent, or Firm* — Hemisphere Law, PLLC

(57)          ABSTRACT

A piezoelectric vibration energy harvester includes: a first support plate, a second support plate, a piezoelectric bimorph cantilever, a rolling part, a printing raceway, a preloading spring and a bottom plate, the first and second support plates are vertically disposed on the bottom plate, two ends of the piezoelectric bimorph cantilever are respectively connected with the first support plate and the rolling part, an end of the preloading spring is fixed on the second support plate, another end of the preloading spring is movably connected with a back surface of the printing raceway, and a surface opposite to the back surface of the printing raceway is in contact with and coupled with the rolling part. The printing raceway can be obtained by programming the number and initial positions of static equilibrium points, and a multi-stable piezoelectric energy harvester with symmetric or asymmetric potential energy well can be realized.

10 Claims, 6 Drawing Sheets

(51) Int. Cl.
  *H02N 2/18* (2006.01)
  *H10N 30/03* (2023.01)
  *H10N 30/853* (2023.01)
  *H10N 30/88* (2023.01)

(52) U.S. Cl.
  CPC ......... *H10N 30/853* (2023.02); *H10N 30/886* (2023.02)

(56) References Cited

U.S. PATENT DOCUMENTS

| | | | | |
|---|---|---|---|---|
| 7,414,351 | B2 * | 8/2008 | Ulm | H02N 2/22 310/330 |
| 7,649,305 | B2 * | 1/2010 | Priya | H10N 30/306 310/339 |
| 7,948,153 | B1 * | 5/2011 | Kellogg | H10N 30/306 310/329 |
| 8,222,754 | B1 * | 7/2012 | Soliman | F03G 7/08 290/1 R |
| 8,866,316 | B2 * | 10/2014 | Wood | H02N 2/188 290/1 R |
| 9,246,414 | B2 * | 1/2016 | Sakaguchi | H02N 2/188 |
| 9,294,015 | B2 * | 3/2016 | Lee | H02N 2/188 |
| 9,780,698 | B2 * | 10/2017 | Lee | H02N 2/188 |
| 9,787,220 | B2 * | 10/2017 | Herder | H02N 2/18 |
| 10,103,653 | B2 * | 10/2018 | Park | H02N 2/186 |
| 11,245,345 | B2 * | 2/2022 | Song | H02N 2/188 |
| 11,271,497 | B2 * | 3/2022 | Aksak | H02N 2/188 |
| 2003/0041767 | A1 * | 3/2003 | Rastegar | F41J 2/00 102/207 |
| 2008/0074002 | A1 * | 3/2008 | Priya | H10N 30/306 310/339 |
| 2008/0079333 | A1 * | 4/2008 | Ulm | B60C 23/0411 310/330 |
| 2008/0174273 | A1 * | 7/2008 | Priya | H10N 30/306 310/319 |
| 2008/0265712 | A1 * | 10/2008 | Ulm | B60C 23/0411 29/25.35 |
| 2010/0258020 | A1 * | 10/2010 | Rastegar | F41H 11/02 102/209 |
| 2012/0194037 | A1 * | 8/2012 | Moler | H02N 2/186 310/339 |
| 2013/0313946 | A1 * | 11/2013 | Lee | H02N 2/188 29/25.35 |
| 2013/0341936 | A1 * | 12/2013 | Wood | H02N 2/188 290/1 R |
| 2015/0035409 | A1 * | 2/2015 | Procopio | H02N 2/188 310/319 |
| 2015/0288299 | A1 * | 10/2015 | Park | H02N 2/186 310/319 |
| 2015/0311826 | A1 * | 10/2015 | Trauernicht | H10N 30/306 29/25.35 |
| 2016/0173006 | A1 * | 6/2016 | Lee | H02N 2/22 310/317 |
| 2018/0367066 | A1 * | 12/2018 | Aksak | H02N 2/22 |
| 2023/0403937 | A1 * | 12/2023 | Wang | H02N 2/22 |

FOREIGN PATENT DOCUMENTS

| | | | | |
|---|---|---|---|---|
| EP | 2677656 | B1 * | 9/2018 | H02N 2/188 |
| JP | 2014007950 | A * | 1/2014 | H02N 2/188 |
| KR | 101243868 | B1 * | 3/2013 | H10N 30/306 |

OTHER PUBLICATIONS

Google Image Search of Published Figure 1. (Year: 2026).*

* cited by examiner

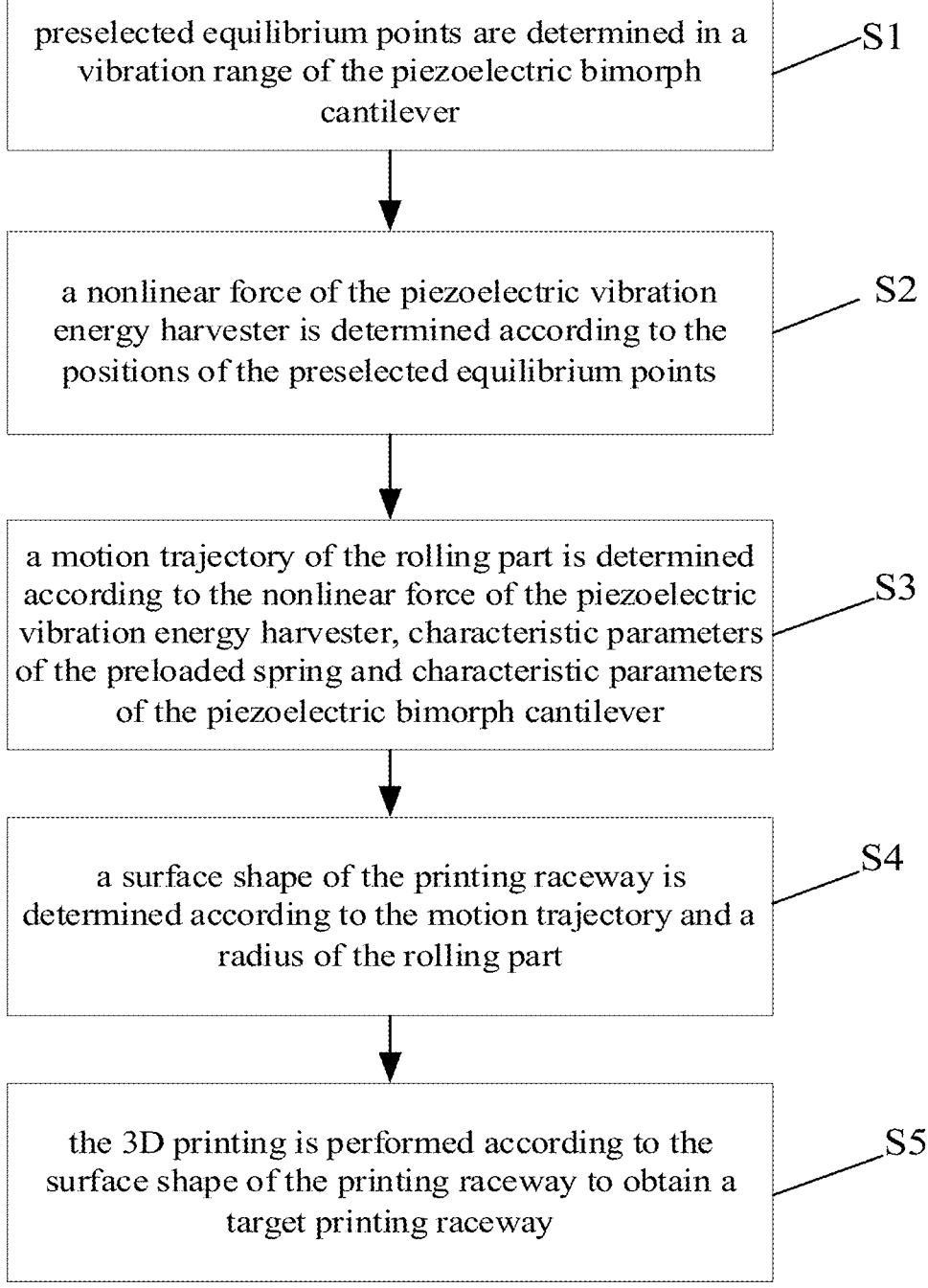

preselected equilibrium points are determined in a vibration range of the piezoelectric bimorph cantilever — S1 a nonlinear force of the piezoelectric vibration energy harvester is determined according to the positions of the preselected equilibrium points — S2 a motion trajectory of the rolling part is determined according to the nonlinear force of the piezoelectric vibration energy harvester, characteristic parameters of the preloaded spring and characteristic parameters of the piezoelectric bimorph cantilever — S3 a surface shape of the printing raceway is determined according to the motion trajectory and a radius of the rolling part — S4 the 3D printing is performed according to the surface shape of the printing raceway to obtain a target printing raceway — S5

FIG. 2

PIEZOELECTRIC VIBRATION ENERGY HARVESTER AND DESIGN METHOD THEREOF

TECHNICAL FIELD

The disclosure relates to the technical field of vibration power generation, in particular to a piezoelectric vibration energy harvester and a design method thereof.

BACKGROUND

A multi-stable piezoelectric vibration energy harvester based on magnet coupling usually includes a piezoelectric bimorph cantilever with terminal magnets and external magnets, which has advantages of wide working frequency band and high harvesting efficiency, and is considered as a novelty micro-energy device that is expected to replace a battery. However, the number, width and depth of a potential energy well of the multi-stable piezoelectric vibration energy harvester based on magnet coupling depend heavily on numbers and arrangement positions of the external magnets, which leads to a rough, inflexible and unconfigured control method of a nonlinear magnetic force, numbers and positions of equilibrium points of the multi-stable piezoelectric vibration energy harvester. Generally, in order to effectively harvest environmental vibration energy with low frequency and low excitation level, a common method is to increase the numbers of the external magnets to make the harvester have multiple equilibrium points and potential energy wells, but this method makes the structure of the piezoelectric vibration energy harvester based on magnet coupling more complicated.

SUMMARY

The purpose of the disclosure is to provide a piezoelectric vibration energy harvester (harvester for short) and a design method thereof, the harvester has simple structure and flexible design, which reduces the complexity of the piezoelectric vibration energy harvester.

In order to achieve the above purpose, the disclosure provides the following solution.

A piezoelectric vibration energy harvester includes: a first support plate, a second support plate, a bottom plate, a piezoelectric bimorph cantilever, a rolling part, a printing raceway and a preloading spring; the first support plate and the second support plate are vertically disposed on the bottom plate; an end of the piezoelectric bimorph cantilever is fixed on a surface of the first support plate, and another end of the piezoelectric bimorph cantilever is fixedly connected with the rolling part; an end of the preloading spring is fixed on a surface of the second support plate, and another end of the preloading spring is movably connected with a back surface of the printing raceway; a surface of the printing raceway is in contact and coupled with the rolling part, the surface of the printing raceway is a surface of the printing raceway opposite to the back surface of the printing raceway, a surface shape of the printing raceway is determined by positions and numbers of preselected equilibrium points, and the printing raceway is configured to provide the preselected equilibrium points and potential energy wells.

Optionally, the piezoelectric bimorph cantilever includes a first piezoelectric ceramic sheet, a metal base and a second piezoelectric ceramic sheet; the first piezoelectric ceramic sheet and the second piezoelectric ceramic sheet are respectively disposed on two sides of a root of the metal base, and a root of the first piezoelectric ceramic sheet, a root of the second piezoelectric ceramic sheet and a root of the metal base are fixed on the surface of the first support plate.

Optionally, polarization directions of the first piezoelectric ceramic sheet and the second piezoelectric ceramic sheet are opposite.

Optionally, the piezoelectric vibration energy harvester further includes a holder; the holder is disposed between the piezoelectric bimorph cantilever and the rolling part, and a side of the holder is fixedly connected with an end of the piezoelectric bimorph cantilever; another side of the holder is provided with an auxiliary rod; and the auxiliary rod is fixedly connected with the rolling part.

Optionally, the rolling part is one of a rolling bearing, a rolling ring, a rolling pulley and a rolling ball.

Optionally, the rolling part is in contact with and coupled with the surface of the printing raceway to transmit a nonlinear force.

Corresponding to the above piezoelectric vibration energy harvester, the disclosure further provides a piezoelectric vibration energy harvester design method, including the following steps:

determining the preselected equilibrium points in a vibration range of the piezoelectric bimorph cantilever;

determining a nonlinear force of the piezoelectric vibration energy harvester according to the positions of the preselected equilibrium points;

determining a motion trajectory of the rolling part according to the nonlinear force of the piezoelectric vibration energy harvester, characteristic parameters of the preloading spring and characteristic parameters of the piezoelectric bimorph cantilever; where the characteristic parameters of the preloading spring include stiffness $K_S$ and a preloading amount $x_0$ of the preloading spring; and the characteristic parameters of the piezoelectric bimorph cantilever include a linear stiffness coefficient $K_1$ and a nonlinear stiffness coefficient $K_2$;

determining a surface shape of the printing raceway according to the motion trajectory and a radius of the rolling part; and performing 3-dimension (3D) printing according to the surface shape of the printing raceway to obtain a target printing raceway.

Optionally, the nonlinear force of the piezoelectric vibration energy harvester is determined by the following formula:

$$F(q) = kq(q - a_1)(q - a_2) \ldots (q - a_{n-1})(q + b_1)(q + b_2) \ldots (q + b_{n-1})$$

$$= k_1 q + k_2 q^2 + \ldots + k_{2n-1} q^{2n-1}$$

Where F(q) is the nonlinear force, k is a correction coefficient, q is a vibration displacement of the piezoelectric bimorph cantilever, $a_i$ and $b_i$, are the positions of the preselected equilibrium points, i=1~n−1, n is the number of the potential energy wells, $k_j$ is a constant in a polynomial form of the formula, j=1~2n−1, and $k_j$ is determined through the positions of the preselected equilibrium points.

Optionally, the motion trajectory of the rolling part is determined by the following formula:

$$S(q) = \sqrt{\frac{k_1 - K_1}{K_s}q^2 + \frac{2k_2}{3K_s}q^3 + \frac{k_3 - K_2}{2K_s}q^4 + \ldots + \frac{k_{2n-1}}{nK_s}q^{2n} + x_0^2} - x_0$$

Where S(q) is the motion trajectory of the rolling part.

Optionally, the surface shape of the printing raceway is determined by the following formula:

$$H(q) = S(q) - r\sqrt{\frac{1}{1+(S'(q))^2}}$$

Where H(q) is the surface shape of the printing raceway, r is the radius of the rolling part, S'(q) is a first derivative of S(q).

According to the embodiments provided by the disclosure, the disclosure discloses the following technical effects.

The disclosure disclosures a piezoelectric vibration energy harvester and a design method thereof, the piezoelectric vibration energy harvester includes: a first support plate, a second support plate, a piezoelectric bimorph cantilever, a rolling part, a printing raceway, a preloading spring and a bottom plate, the first support plate and the second support plate are vertically disposed on the bottom plate, an end of the piezoelectric bimorph cantilever is fixed on a surface of the first support plate, another end of the piezoelectric bimorph cantilever is fixedly connected with the rolling part, an end of the preloading spring is fixed on a surface of the second support plate, another end of the preloading spring is movably connected with a back surface of the printing raceway, a surface of the printing raceway is in contact with and coupled with the rolling part, the surface of the printing raceway is a surface of the printing raceway opposite to the back surface of the printing raceway, a surface shape of the printing raceway is determined by positions and numbers of preselected equilibrium points, and the printing raceway is configured to provide the preselected equilibrium points and potential energy wells. According to the piezoelectric vibration energy harvester and the design method thereof provided by the disclosure, the positions and the numbers of the preselected equilibrium points of the piezoelectric vibration energy harvester are completely determined by a curved surface of the printing raceway, and the piezoelectric vibration energy harvester is simple in structure and flexible in design. According to different requirements, different trajectory curves can be designed for the printing raceway, and the specific 3D printing can be performed. Compared with the existing multi-stable piezoelectric vibration energy harvester based on magnet coupling, the piezoelectric vibration energy harvester of the disclosure is not affected by magnetic field distribution, and a large number of magnet blocks are not needed in the piezoelectric vibration energy harvester, thus reducing the complexity of the piezoelectric vibration energy harvester.

BRIEF DESCRIPTION OF DRAWINGS

In order to provide a clearer explanation of embodiments of the disclosure or the technical solutions in the prior art, a brief introduction will be given to the accompanying drawings required in the embodiments. It is evident that the accompanying drawings in the following description are only some of the embodiments of the disclosure. For those skilled in the art, other accompanying drawings can be obtained based on these drawings without any creative effort.

FIG. 2 illustrates a flowchart of a design method of a piezoelectric vibration energy harvester according to an embodiment 2 of the disclosure.

DESCRIPTION OF REFERENCE SYMBOLS

1-1: first support plate; 1-2: second support plate; 1-3: bottom plate; 2: piezoelectric bimorph cantilever; 2-1: first piezoelectric ceramic sheet; 2-2: second piezoelectric ceramic sheet; 2-3: metal base; 3: rolling part; 4: printing raceway; 5: preloading spring; 5-1: first horizontal spring; 5-2: second horizontal spring; 6: load resistor; 7: holder.

DETAILED DESCRIPTION OF EMBODIMENTS

The following will provide a clear and complete description of the technical solution in the embodiments of the disclosure, in conjunction with the accompanying drawings. Apparently, the described embodiments are only some of the embodiments of the disclosure, not all of them. Based on the embodiments in the disclosure, all other embodiments obtained by those skilled in the art without creative labor fall within the scope of protection of the disclosure.

The purpose of the disclosure is to provide a piezoelectric vibration energy harvester and its design method, which has a simple structure, flexible design, and reduces the complexity of the piezoelectric vibration energy harvester.

In order to make the above purpose, features, and advantages of the disclosure more apparent and understandable, the following will provide further detailed explanations of the disclosure in conjunction with the accompanying drawings and specific embodiments.

Embodiment 1

Figure 1:
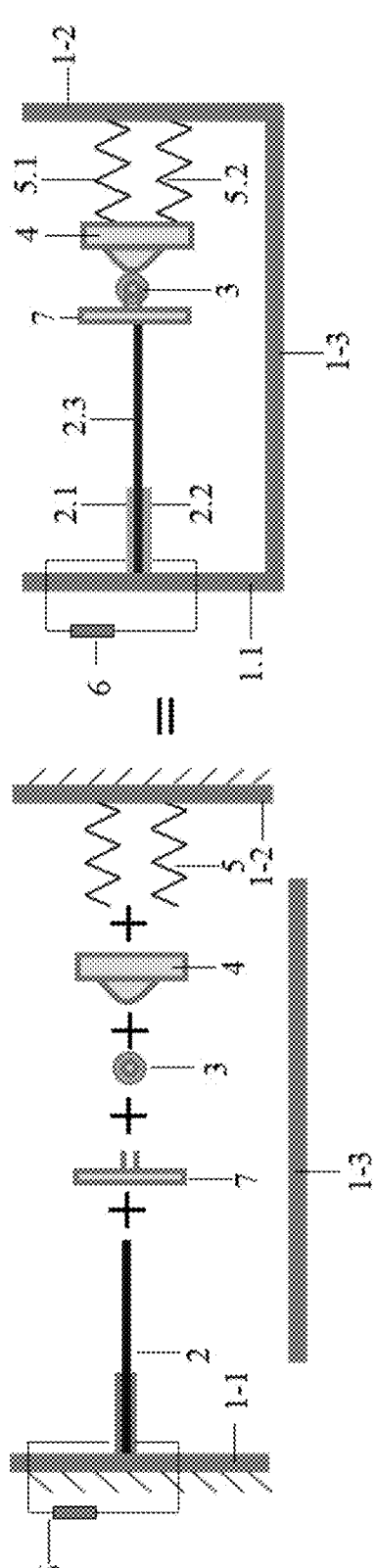
FIG. 1 illustrates a schematic diagram of a piezoelectric vibration energy harvester according to an embodiment 1 of the disclosure.
Figure 3A:
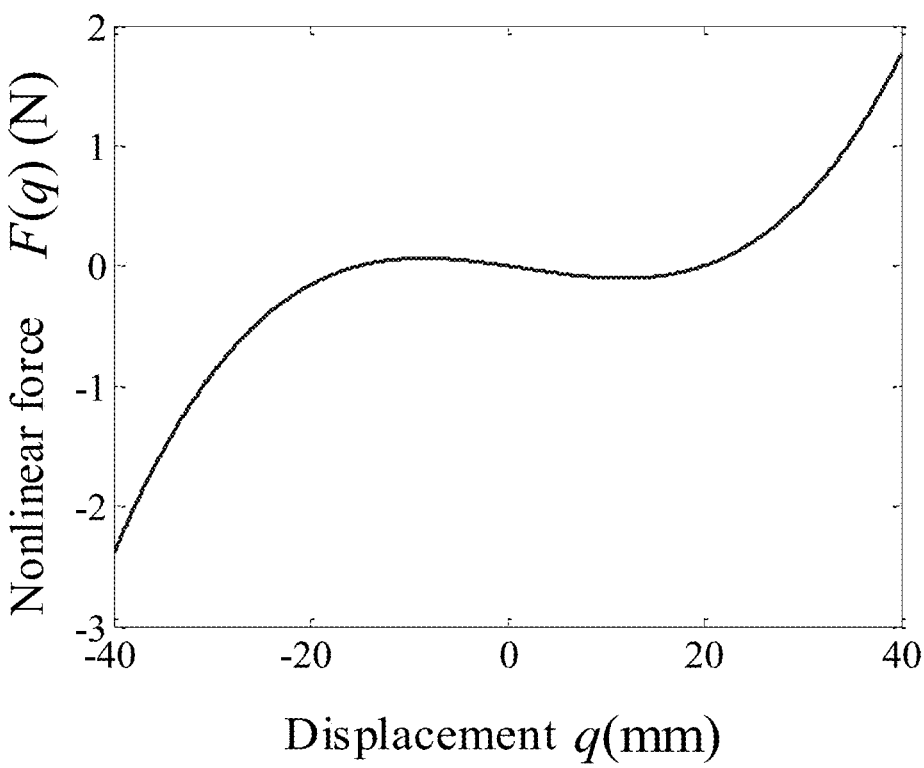
FIG. 3A illustrates a schematic diagram showing an experimental result on a nonlinear force when n=2, $a_1$=20 mm, $b_1$=−15 mm, $K_1$=4000 N/m, $K_S$=100 N/m and $x_0$=10 mm according to the embodiment 2 of the disclosure.
Figure 3B:
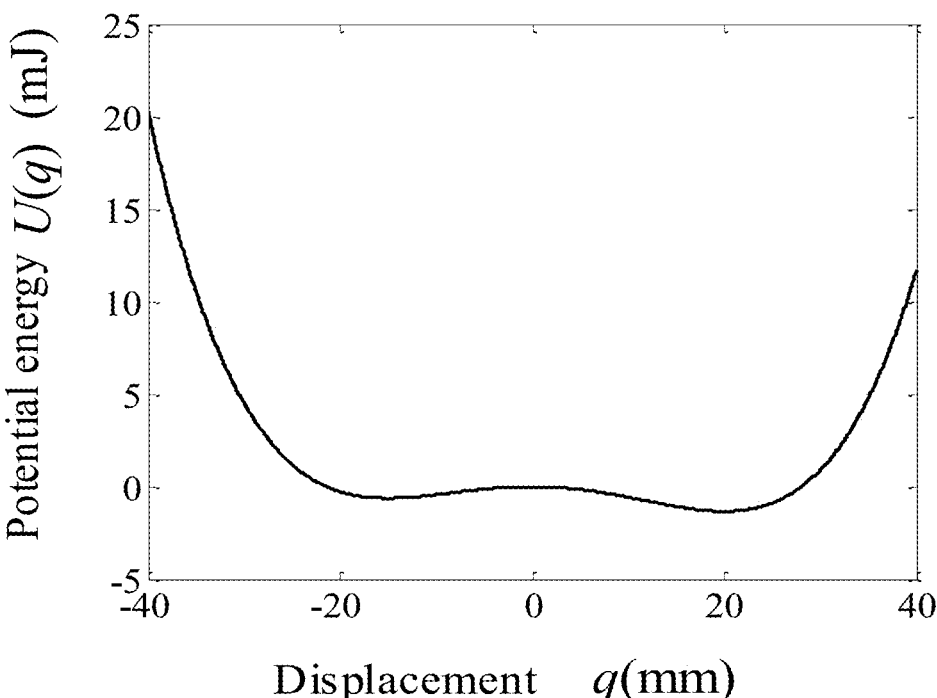
FIG. 3B illustrates a schematic diagram showing an experimental result on a potential energy when n=2, $a_1$=20 mm, $b_1$=−15 mm, $K_1$=4000 N/m, $K_S$=100 N/m and $x_0$=10 mm according to the embodiment 2 of the disclosure.
Figure 3C:
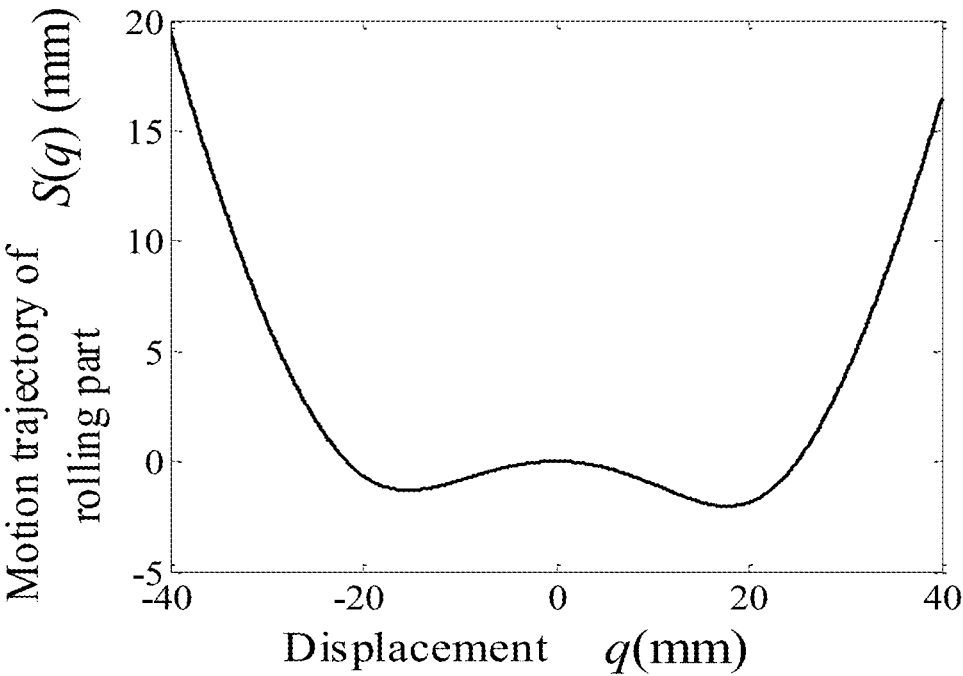
FIG. 3C illustrates a schematic diagram showing an experimental result on a motion trajectory of a rolling part when n=2, $a_1$=20 mm, $b_1$=−15 mm, $K_1$=4000 N/m, $K_S$=100 N/m and $x_0$=10 mm according to the embodiment 2 of the disclosure.
Figure 3D:
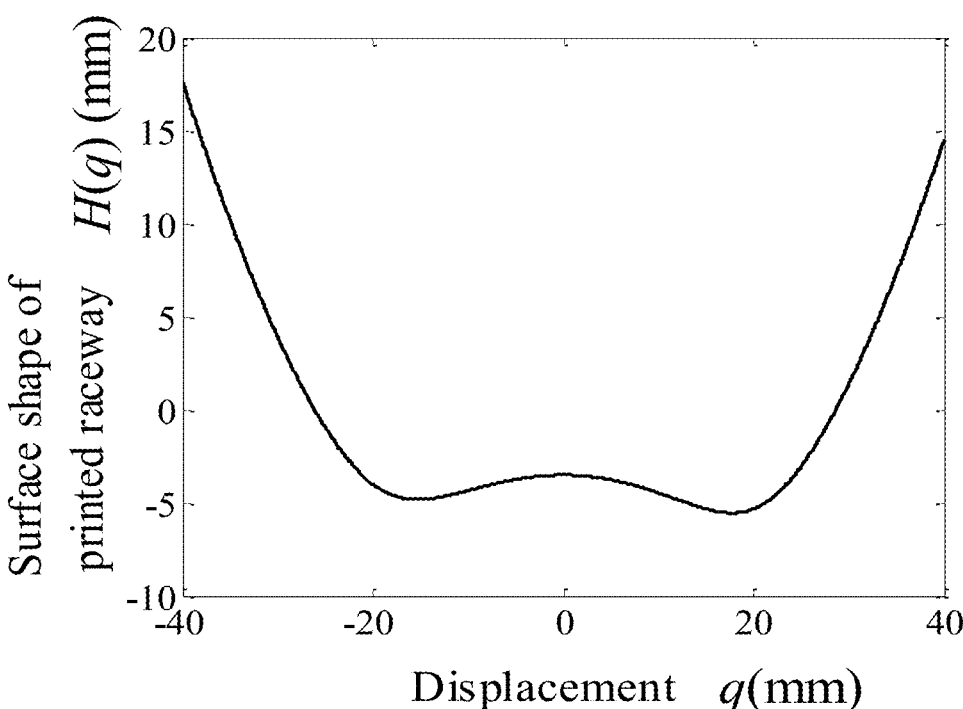
FIG. 3D illustrates a schematic diagram showing an experimental result on a surface shape of a printing raceway when n=2, $a_1$=20 mm, $b_1$=−15 mm, $K_1$=4000 N/m, $K_S$=100 N/m and $x_0$=10 mm according to the embodiment 2 of the disclosure.
Figure 4A:
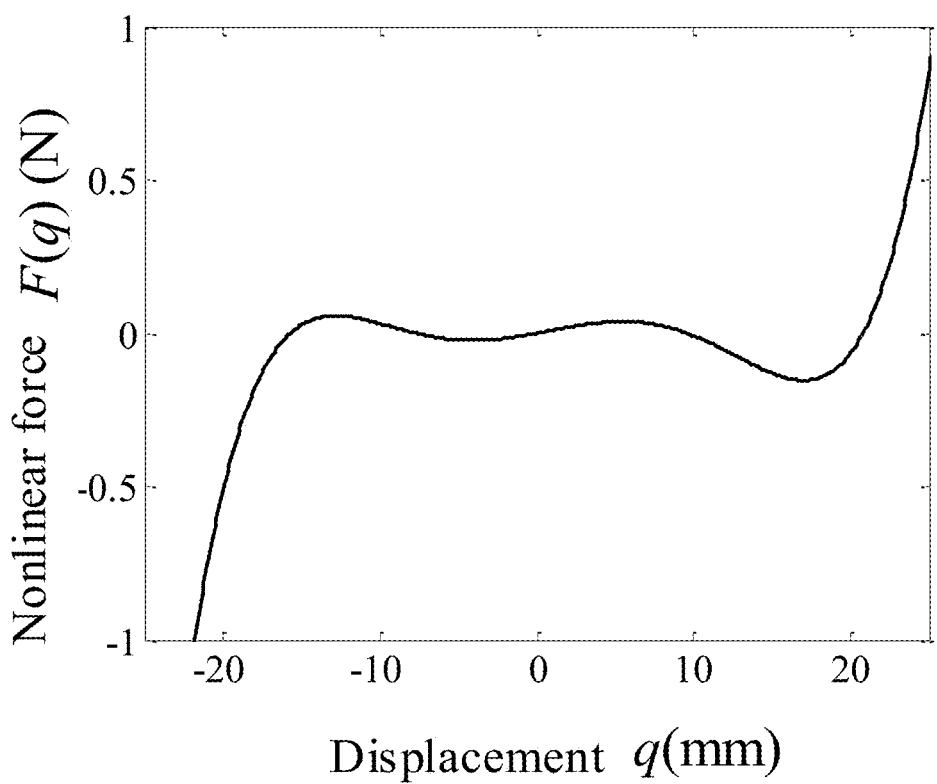
FIG. 4A illustrates a schematic diagram showing an experimental result on a nonlinear force when n=3, $a_1$=20 mm, $a_2$=10 mm, $b_1$=−15 mm, $b_2$=−8 mm, $K_1$=4×10⁸ N/m, $K_S$=100 N/m and $x_0$=10 mm according to the embodiment 2 of the disclosure.
Figure 4B:
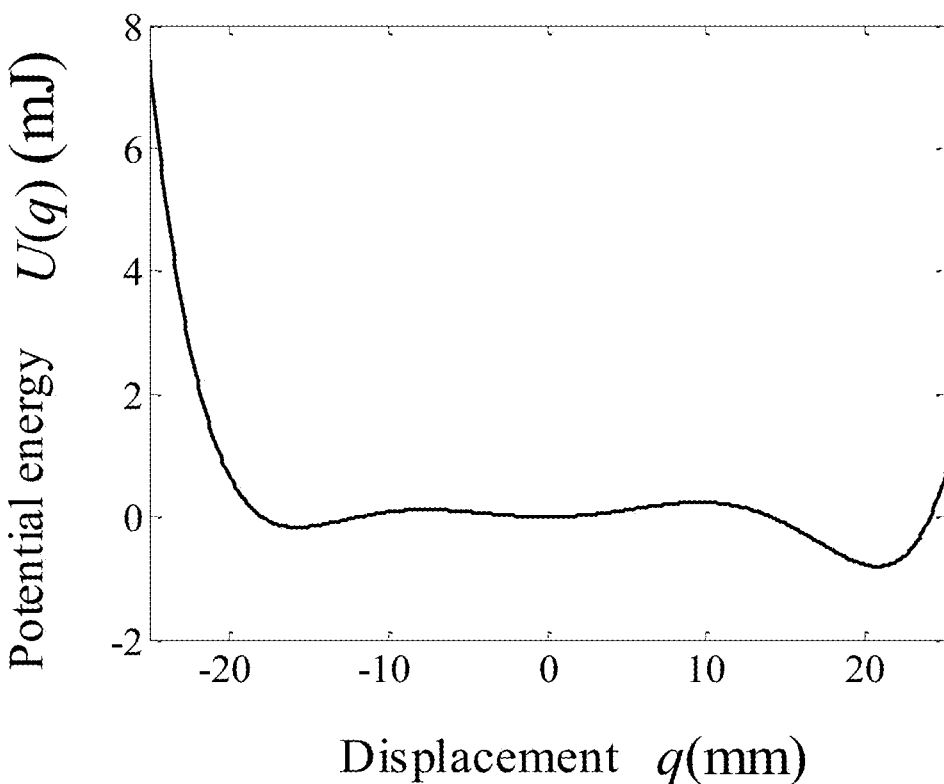
FIG. 4B illustrates a schematic diagram showing an experimental result on a potential energy when n=3, $a_1$=20 mm, $a_2$=10 mm, $b_1$=−15 mm, $b_2$=−8 mm, $K_1$=4×10⁸ N/m, $K_S$=100 N/m and $x_0$=10 mm according to the embodiment 2 of the disclosure.
Figure 4C:
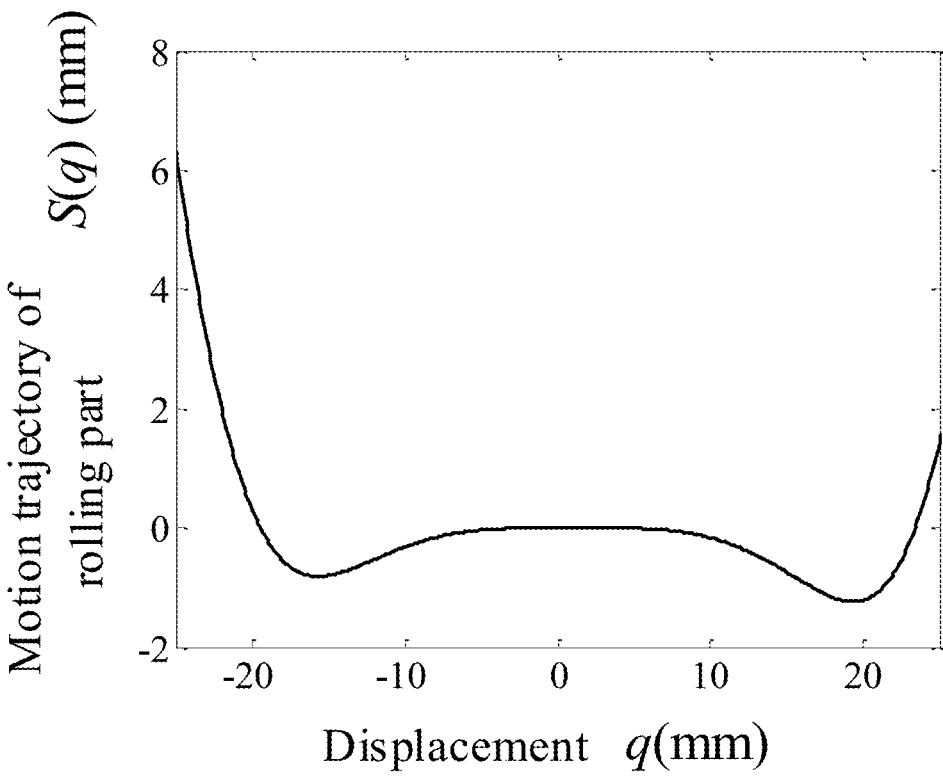
FIG. 4C illustrates a schematic diagram showing an experimental result on a motion trajectory of a rolling part when n=3, $a_1$=20 mm, $a_2$=10 mm, $b_1$=−15 mm, $b_2$=−8 mm, $K_1$=4×10⁸ N/m, $K_S$=100 N/m and $x_0$=10 mm according to the embodiment 2 of the disclosure.
Figure 4D:
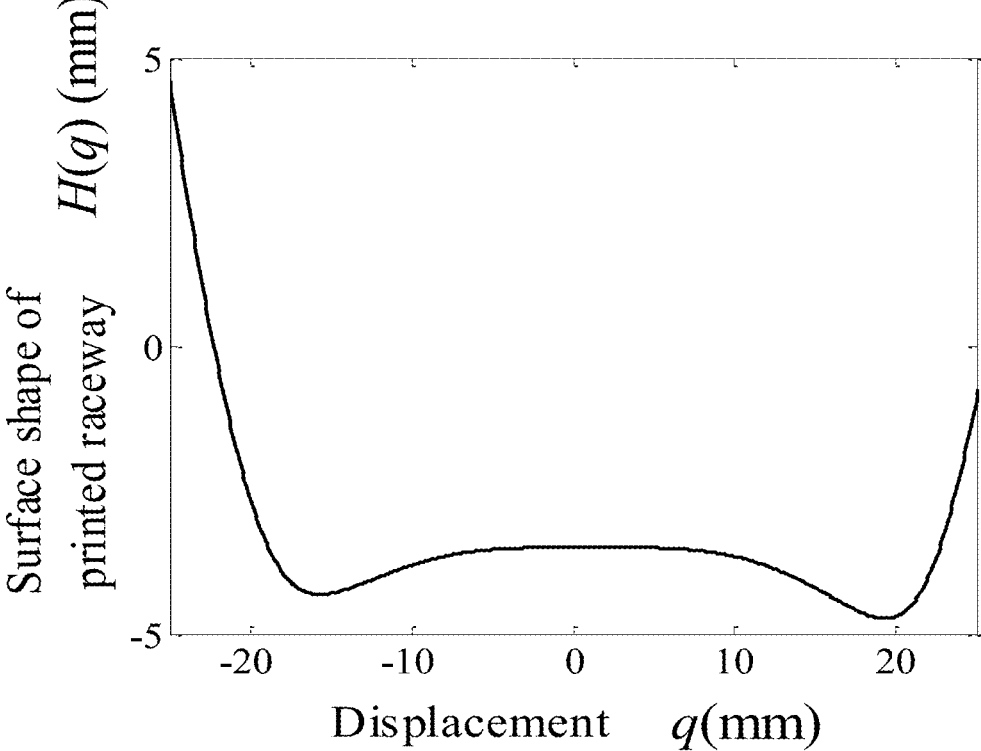
FIG. 4D illustrates a schematic diagram showing an experimental result on a surface shape of a printing raceway when n=3, $a_1$=20 mm, $a_2$=10 mm, $b_1$=−15 mm, $b_2$=−8 mm, $K_1$=4×10⁸ N/m, $K_S$=100 N/m and $x_0$=10 mm according to the embodiment 2 of the disclosure.

The embodiment 1 provides a piezoelectric vibration energy harvester. As shown in FIG. 1, the piezoelectric vibration energy harvester includes: a first support plate 1-1, a second support plate 1-2, a bottom plate 1-3, a piezoelectric bimorph cantilever 2, a rolling part 3, a printing raceway 4 and a preloading spring 5.

The first support plate 1-1 and the second support plate 1-2 are vertically disposed on the bottom plate 1-3.

An end of the piezoelectric bimorph cantilever 2 is fixed on a surface of the first support plate 1-1, and another end of the piezoelectric bimorph cantilever 2 is fixedly connected with the rolling part 3.

An end of the preloading spring 5 is fixed on a surface of the second support plate 1-2, and another end of the preloading spring 5 is movably connected with a back surface of the printing raceway 4. The preloading spring 5 may include a first horizontal spring 5-1, a second horizontal spring 5-2, etc., which are connected in parallel and have a same initial length and elastic coefficient.

A surface of the printing raceway 4 is in contact and coupled with the rolling part 3. The surface of the printing raceway 4 is the surface of the printing raceway 4 opposite to the back surface of the printing raceway 4. A surface shape of the printing raceway 4 is determined by positions and numbers of preselected equilibrium points, and the printing raceway 4 is used to provide preset preselected equilibrium points and potential energy wells. In this embodiment, the printing raceway 4 and the rolling part 3 are printed with a polyvinylidene difluoride (PVDF) material.

In this embodiment, the piezoelectric bimorph cantilever 2 includes a first piezoelectric ceramic sheet 2-1, a metal base 2-3 and a second piezoelectric ceramic sheet 2-2. The first piezoelectric ceramic sheet 2-1 and the second piezoelectric ceramic sheet 2-2 are respectively disposed on two sides of a root of the metal base 2-3. Roots of the first piezoelectric ceramic sheet 2-1, the second piezoelectric ceramic sheet 2-2 and the metal base 2-3 are fixed on the surface of the first support plate 1-1.

Polarization directions of the first piezoelectric ceramic sheet 2-1 and the second piezoelectric ceramic sheet 2-2 are opposite. The first piezoelectric ceramic plate 2-1 and the second piezoelectric ceramic plate 2-2 are connected with the same load resistor 6 through wires. The first piezoelectric ceramic plate 2-1 and the second piezoelectric ceramic plate 2-2 generate the stress deformation under the multi-stable vibration, and generate induced charges on their surfaces through the piezoelectric effect, and then the induced charges flow through the load resistor 6 through the wires to form a current, so that the environmental vibration energy can be harvested and converted into the electric energy.

As another possible embodiment, the piezoelectric vibration energy harvester further includes a holder 7. The holder 7 is disposed between the piezoelectric bimorph cantilever 2 and the rolling part 3, a side of the holder 7 is fixedly connected with an end of the piezoelectric bimorph cantilever 2, another side of the holder 7 is provided with an auxiliary rod, and the auxiliary rod is fixedly connected with the rolling part 3.

As many possible options, the rolling part 3 can be any one of a rolling bearing, a rolling ring, a rolling pulley and a rolling ball.

The rolling part 3 and the surface of the printing raceway 4 transmit a nonlinear force through contact coupling (i.e., the rolling part 3 is in contact with and coupled with the surface of the printing raceway 4 to transmit the nonlinear force). The printing raceway 4 is contacted by the rolling part 3 to urge the preloading spring 5 to stretch and compress horizontally, so that a contact force between the rolling part 3 and the printing raceway 4 can be adjusted in real time, the nonlinear force on the piezoelectric bimorph cantilever 2 and the depth and width of the potential energy well can be adjusted adaptively, thus improving the comprehensive output performance of the harvester.

Embodiment 2

As shown in FIG. 2, corresponding to the piezoelectric vibration energy harvester provided in the embodiment 1, this embodiment provides a design method of a piezoelectric vibration energy harvester, including the following steps.

S1, multiple preselected equilibrium points $a_1$, $a_2$, . . . , $a_{n-1}$, $b_1$, $b_2$, . . . , $b_{n-1}$ are determined in a vibration range of the piezoelectric bimorph cantilever. In order to optimize the comprehensive output performance of the harvester, the numbers and positions of the equilibrium point coordinates can be adjusted by programming, so that the width of the potential energy well of the designed harvester becomes larger and the depth of the potential energy well of the designed harvester becomes shallower, which is beneficial to the harvester to oscillate with large amplitude at low excitation level.

S2, a nonlinear force of the piezoelectric vibration energy harvester is determined according to the positions of the preselected equilibrium points. The nonlinear force of the piezoelectric vibration energy harvester can be determined by the following formula:

$$F(q) = kq(q - a_1)(q - a_2) \ldots (q - a_{n-1})(q + b_1)(q + b_2) \ldots (q + b_{n-1})$$

$$= k_1 q + k_2 q^2 + \ldots + k_{2n-1} q^{2n-1}$$

Where F(q) is the nonlinear force, k is a correction coefficient, q is a vibration displacement of the piezoelectric bimorph cantilever, $a_i$ and $b_i$ are the positions of the equilibrium points, i=1~n−1, n is the number of the potential energy wells, above formula defines 2n−1 numbers of the equilibrium points, and n−1 numbers of the equilibrium points are stable. When $a_i = b_i$, the potential energy wells of the harvester are symmetrical. When $a_i \neq b_i$, the potential energy wells of the harvester are not symmetrical. $k_j$ is a constant in a polynomial form of the nonlinear force formula, j=1~2n−1. $k_j$ is determined through the positions of the equilibrium points, for example, when n=2, the harvester is an asymmetric bistable system, at this time:

$$k_1 = -ka_1 b_1,$$

$$k_2 = k(-a_1 + b_1),$$

$$k_3 = k.$$

When n=3, the harvester is an asymmetric tristable system, at this time:

$$k_1 = ka_1a_2b_1b_2,$$

$$k_2 = k(a_1a_2b_1 + a_1a_2b_2 - a_1b_1b_2 - a_2b_1b_2),$$

$$k_3 = -k(a_1a_2 + a_1b_1 + a_2b_2 + b_1b_2 - a_1b_2 - a_2b_1),$$

$$k_4 = k(-a_1 - a_2 + b_1 + b_2),$$

$$k_5 = k.$$

According to the nonlinear force formula, a total potential energy function of the harvester can be obtained as follows:

$$U(q) = \frac{k_1 q^2}{2} + \frac{k_2 q^3}{3} + \frac{k_3 q^4}{4} + \ldots + \frac{k_{2n-1} q^{2n}}{2n}.$$

Considering the geometric nonlinearity of the piezoelectric bimorph cantilever, the following formula can be obtained:

$$U(q) = \frac{K_1 q^2}{2} + \frac{K_2 q^4}{4} + \frac{K_s(x_0 + S(q))^2}{2} - \frac{K_s x_0^2}{2}.$$

S3, a motion trajectory of the rolling part is determined according to the nonlinear force of the piezoelectric vibration energy harvester, characteristic parameters of the preloading spring and characteristic parameters of the piezoelectric bimorph cantilever. The characteristic parameters of the preloading spring include stiffness $K_s$ and a preloading amount $x_0$ of the preloading spring. The characteristic parameters of the piezoelectric bimorph cantilever include a linear stiffness coefficient $K_1$ and a nonlinear stiffness coefficient $K_2$. The linear stiffness coefficient $K_1$ and the nonlinear stiffness coefficient $K_2$ of the piezoelectric bimorph cantilever are determined by the structure and material characteristics of the piezoelectric bimorph cantilever. The motion trajectory of the rolling part can be determined by the following formula:

$$S(q) = \sqrt{\frac{k_1 - K_1}{K_s}q^2 + \frac{2k_2}{3K_s}q^3 + \frac{k_3 - K_2}{2K_s}q^4 + \ldots + \frac{k_{2n-1}}{nK_s}q^{2n} + x_0^2} - x_0.$$

Where S(q) is the motion trajectory of the rolling part.

S4, a surface shape of the printing raceway is determined according to the motion trajectory and a radius of the rolling part. The surface shape of the printing raceway can be determined by the following formula:

$$H(q) = S(q) - r\sqrt{\frac{1}{1 + (S'(q))^2}}.$$

Where H(q) is the surface shape of the printing raceway, r is the radius of the rolling part, S'(q) is a first derivative of the S(q).

S5, the 3-dimension (3D) printing is performed according to the surface shape of the printing raceway to obtain a target printing raceway.

In order to prevent the rolling part from producing large friction loss on the printing raceway, after obtaining the target printing raceway, the method further includes performing mechanical polishing and lubrication on the target printing raceway.

Before the step 5 of performing 3D printing according to the surface shape of the printing raceway, the following steps are performed.

Simulating and calculating a total potential energy of the piezoelectric vibration energy harvester, and simulating and analyzing a potential energy curve.

Determining whether an optimization goal is met. The optimization goal here can be to determine whether the maximum potential barrier is the smallest or the coordinates of the maximum equilibrium point are the largest.

If the optimization goal is met, performing the 3D printing directly; otherwise, going back to step S1 and reselecting the numbers and positions of preselected equilibrium points.

The piezoelectric vibration energy harvester provided by the disclosure will be described with several specific examples:

The design parameters are that the number of potential energy wells is that n=2, and the number of equilibrium points is that 2n−1=3, that is, the first equilibrium point $a_1$=20 mm and the second equilibrium point $b_1$=−15 mm except the initial equilibrium point of 0 mm, the linear stiffness of the piezoelectric bimorph cantilever is that $K_1$=4000 N/m, the stiffness of the preloading spring is that $K_s$=100 N/m, and the preloading amount of the preloading spring is that $x_0$=10 mm. The above parameters are substituted into the design method of the harvester, the nonlinear force, the potential energy, the center trajectory (i.e., motion trajectory) of the rolling bearing (i.e., rolling part) and the surface shape of the printing raceway can be generated as shown in FIG. 3A to FIG. 3D, respectively. At this time, the nonlinear force has three equilibrium points, which are 20 mm, −15 mm and 0 respectively; the potential energy has two asymmetric potential energy wells, and the depth and width of the right potential energy well are slightly larger than those of the left potential energy well; and the center trajectory of the rolling bearing and the surface shape of the printing raceway are also asymmetric.

The design parameters are that the number of potential energy wells is that n=3, and the number of equilibrium points is that 2n−1=5, that is, the first equilibrium point $a_1$=20 mm and the second equilibrium point $a_2$=10 mm, the third equilibrium point that $b_1$=−15 mm and the fourth equilibrium point $b_2$=−8 mm except the initial equilibrium point of 0 mm, the linear stiffness of the piezoelectric bimorph cantilever is that $K_1$=4×10⁸ N/m, the stiffness of the preloading spring is that $K_s$=100 N/m, and the preloading amount of the preloading spring is that $x_0$=10 mm. The above parameters are substituted into the design method of the harvester, the nonlinear force, the potential energy, the center trajectory (i.e., motion trajectory) of the rolling bearing (i.e., rolling part) and the surface shape of the printing raceway (i.e., 3D printing raceway curve) can be generated as shown in FIG. 4A to FIG. 4D, respectively. At this time, the nonlinear force has five equilibrium points, which are 20 mm, 10 mm, −15 mm, −8 mm and 0 respectively; the potential energy has three potential energy wells, and the depth and width of the right outer potential energy well are slightly larger than those of the left outer potential energy well; and the center trajectory of the rolling bearing and the surface shape of the printing raceway are asymmetric.

Furthermore, the position design of initial programmable equilibrium points are as follows: $a_1$=20 mm, $a_2$=10 mm, $b_1=-20$ mm and $b_2=-10$ mm, the calculated nonlinear force, the potential energy, the center trajectory of the rolling bearing and the surface shape of the printing raceway have symmetrical tristable motion characteristics, the depth and width of the right outer potential energy well are the same as those of the left outer potential energy well, and they are symmetrical about the initial equilibrium point of 0 mm.

Furthermore, the numbers and coordinates (i.e., positions) $a_1$, $a_2$, . . . , $a_{n-1}$, $b_1$, $b_2$, . . . , $b_{n-1}$ of the programmable equilibrium points are changed, the above design method of the harvester can be used to design any symmetric and asymmetric multi-stable piezoelectric vibration energy harvester.

The program part in the technology can be considered as a "product" or "artifact" that exists in the form of executable code and/or related data, participated in or implemented through computer-readable media. A tangible and permanent storage medium can include memory or storage used by any computer, processor, or similar device or related module, such as various semiconductor memories, tape drives, disk drives, or similar devices that can provide storage functionality for software.

All software or a portion of it may sometimes communicate through a network, such as the Internet or other communication networks. This type of communication can load software from one computer device or processor to another. For example, a hardware platform loaded from a server or host computer of a video object detection device to a computer environment, or other computer environment that implements the system, or a system with similar functions related to providing information required for object detection. Therefore, another medium that can transmit software elements can be used as a physical connection between local devices, such as light waves, radio waves, electromagnetic waves, etc., which propagate through cables, optical cables, or air. The physical medium used for carrier communication, such as cables, wireless connections, or optical cables, can be considered as the medium for carrying software. Unless the usage here limits tangible "storage" media, other terms referring to computer or machine "readable media" refer to the media involved in the execution of any instruction by the processor.

Specific embodiments have been applied in this article, but the above description only explains the principles and implementation methods of the disclosure. The explanations of the above embodiments are only used to help understand the methods and core ideas of the disclosure. Those skilled in the art should understand that the various modules or steps of the disclosure can be implemented using a universal computer device, and alternatively, they can be implemented using program code that can be executed by the computing device. Therefore, they can be stored in a storage device for execution by the computing device, or they can be separately made into various integrated circuit modules, or multiple modules or steps within them can be made into a single integrated circuit module for implementation. The disclosure is not limited to any specific combination of hardware and software.

Meanwhile, for those skilled in the art, there may be changes in specific implementation methods and application scope based on the ideas of the disclosure. In summary, the content of this specification should not be understood as a limitation of the disclosure.

What is claimed is:

1. A piezoelectric vibration energy harvester, comprising: a first support plate, a second support plate, a bottom plate, a piezoelectric bimorph cantilever, a rolling part, a printing raceway and a preloading spring;

wherein the first support plate and the second support plate are vertically disposed on the bottom plate;

wherein an end of the piezoelectric bimorph cantilever is fixed on a surface of the first support plate, and another end of the piezoelectric bimorph cantilever is fixedly connected with the rolling part;

wherein an end of the preloading spring is fixed on a surface of the second support plate, and another end of the preloading spring is movably connected with a back surface of the printing raceway;

wherein a surface of the printing raceway is in contact and coupled with the rolling part, the surface of the printing raceway is a surface of the printing raceway opposite to the back surface of the printing raceway, a surface shape of the printing raceway is determined by positions and numbers of preselected equilibrium points, and the printing raceway is configured to provide the preselected equilibrium points and potential energy wells.

2. The piezoelectric vibration energy harvester as claimed in claim 1, wherein the piezoelectric bimorph cantilever comprises a first piezoelectric ceramic sheet, a metal base and a second piezoelectric ceramic sheet; the first piezoelectric ceramic sheet and the second piezoelectric ceramic sheet are respectively disposed on two sides of a root of the metal base, and a root of the first piezoelectric ceramic sheet, a root of the second piezoelectric ceramic sheet and a root of the metal base are fixed on the surface of the first support plate.

3. The piezoelectric vibration energy harvester as claimed in claim 2, wherein polarization directions of the first piezoelectric ceramic sheet and the second piezoelectric ceramic sheet are opposite.

4. The piezoelectric vibration energy harvester as claimed in claim 1, wherein the piezoelectric vibration energy harvester further comprises a holder;

the holder is disposed between the piezoelectric bimorph cantilever and the rolling part, and a side of the holder is fixedly connected with an end of the piezoelectric bimorph cantilever;

another side of the holder is provided with an auxiliary rod; and the auxiliary rod is fixedly connected with the rolling part.

5. The piezoelectric vibration energy harvester as claimed in claim 1, wherein the rolling part is one of a rolling bearing, a rolling ring, a rolling pulley and a rolling ball.

6. The piezoelectric vibration energy harvester as claimed in claim 1, wherein the rolling part is in contact with and coupled with the surface of the printing raceway to transmit a nonlinear force.

7. A piezoelectric vibration energy harvester design method, applied to the piezoelectric vibration energy harvester as claimed in claim 1, comprising:

determining the preselected equilibrium points in a vibration range of the piezoelectric bimorph cantilever;

determining a nonlinear force of the piezoelectric vibration energy harvester according to the positions of the preselected equilibrium points;

determining a motion trajectory of the rolling part according to the nonlinear force of the piezoelectric vibration energy harvester, characteristic parameters of the preloading spring and characteristic parameters of the piezoelectric bimorph cantilever; wherein the characteristic parameters of the preloading spring comprise stiffness $K_s$ and a preloading amount $x_0$ of the preloading spring; and the characteristic parameters of the piezoelectric bimorph cantilever comprise a linear stiffness coefficient $K_1$ and a nonlinear stiffness coefficient $K_2$;

determining a surface shape of the printing raceway according to the motion trajectory and a radius of the rolling part; and performing 3-dimension (3D) printing according to the surface shape of the printing raceway to obtain a target printing raceway.

8. The design method as claimed in claim 7, wherein the determining a nonlinear force of the piezoelectric vibration energy harvester according to the positions of the preselected equilibrium points, comprises:

determining the nonlinear force of the piezoelectric vibration energy harvester by the following formula:

$$F(q) = kq(q - a_1)(q - a_2) \dots (q - a_{n-1})(q + b_1)(q + b_2) \dots (q + b_{n-1})$$
$$= k_1 q + k_2 q^2 + \dots + k_{2n-1} q^{2n-1};$$

where F(q) is the nonlinear force, k is a correction coefficient, q is a vibration displacement of the piezoelectric bimorph cantilever, $a_i$ and $b_i$ are the positions of the preselected equilibrium points, i=1~n−1, n is the number of the potential energy wells, $k_j$ is a constant in a polynomial form of the formula, j=1~2n−1, and $k_j$ is determined through the positions of the preselected equilibrium points.

9. The design method as claimed in claim 8, wherein the determining a motion trajectory of the rolling part according to the nonlinear force of the piezoelectric vibration energy harvester, characteristic parameters of the preloading spring and characteristic parameters of the piezoelectric bimorph cantilever, comprises:

determining the motion trajectory of the rolling part by the following formula:

$$S(q) = \sqrt{\frac{k_1 - K_1}{K_s} q^2 + \frac{2k_2}{3K_s} q^3 + \frac{k_3 - K_2}{2K_s} q^4 + \dots + \frac{k_{2n-1}}{nK_s} q^{2n} + x_0^2} - x_0;$$

where S(q) is the motion trajectory of the rolling part.

10. The design method as claimed in claim 9, wherein the determining a surface shape of the printing raceway according to the motion trajectory and a radius of the rolling part comprises:

determining the surface shape of the printing raceway by the following formula:

$$H(q) = S(q) - r \sqrt{\frac{1}{1 + (S'(q))^2}} ;$$

where H(q) is the surface shape of the printing raceway, r is the radius of the rolling part, S'(q) is a first derivative of S(q).

\* \* \* \* \*